(12) United States Patent
Sakamoto et al.

(10) Patent No.: US 6,369,676 B2
(45) Date of Patent: *Apr. 9, 2002

(54) HIGH-FREQUENCY MODULE

(75) Inventors: Koichi Sakamoto, Otsu; Sadao Yamashita, Kyoto; Takatoshi Kato, Mino; Yasutaka Fujii; Kenichi Iio, both of Nagaokakyo; Toshiro Hiratsuka, Kusatsu, all of (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/240,241

(22) Filed: Jan. 29, 1999

(30) Foreign Application Priority Data

Jan. 29, 1998 (JP) ............................................. 10-017006

(51) Int. Cl.⁷ .................................................. H01P 7/10
(52) U.S. Cl. ..................... 333/219.1; 333/219; 333/202; 331/107 DP
(58) Field of Search .............................. 333/219.1, 219, 333/202; 331/107 DP, 107 R, 107 SL, 177 V

(56) References Cited

U.S. PATENT DOCUMENTS 4,477,785 A * 10/1984 Atia ............................ 333/202

FOREIGN PATENT DOCUMENTS

| EP | 0734088 A1 | 9/1996 |
|---|---|---|
| EP | 0917231 A2 | 5/1999 |
| JP | 3128319 | 12/1991 |
| JP | 4157804 | 5/1992 |
| JP | 5818890611 | 11/1993 |

OTHER PUBLICATIONS

XP 000655353; B.S. Virdee; Effective Technique for Electronically Tuning a Dielectric Resonator; vol. 33, No. 4, pp. 301–302; Feb. 13, 1997.

Japanses Article Proceedings of the 1997 Electronics Society Conference of IEICE dated Mar. 9, 1997.

* cited by examiner

Primary Examiner—Robert Pascal
Assistant Examiner—Stephen E. Jones
(74) Attorney, Agent, or Firm—Ostrolenk, Faber, Gerg & Soffen, LLP

(57) ABSTRACT

A high-frequency module which includes a dielectric resonator defined by a dielectric sheet; a pair of electrodes formed on each of the main surfaces of the dielectric sheet and having aligned openings which form a dielectric resonator; a substrate stacked on the sheet; and lines disposed on the substrate for being coupled to the dielectric resonator. At least one of the lines is curved and is disposed just inside the opening and runs substantially along the edges of the openings.

13 Claims, 6 Drawing Sheets

HIGH-FREQUENCY MODULE

CROSS-REFERENCE TO RELATED APPLICATION

This application is related to U.S. Ser. No. 08/965,464 filed Nov. 21, 1997, now U.S. Pat. No. 6,016,090, the disclosures of which are incorporated by reference herein.

BACKGROUND OF THE INVENTION

1. Field of the Invention

The present invention relates to a high-frequency module, and more particularly, to a resonator, a filter, an oscillator, or the like, for use in microwave band or millimeter wave band communication.

2. Description of Related Art

With the recently expanding demand for a mobile communication systems, the millimeter wave band has been widely used in order to increase the available information-carrying capacity.

For use in such a system, a high-frequency dielectric filter or a high-frequency voltage-controlled oscillator (VCO) may include, for example, a TE01δ-mode dielectric resonator in a cylindrical form.

In general, the resonant frequency of the resonator is determined by its shape, while the strength of electromagnetic coupling between the resonator and a micro-strip or the like is determined by the distance between them. Thus, in order to produce a filter or a resonator which meets a desired specification, the formation of a shape of the resonator and positioning of the same require great precision.

In Laid-open Japanese Patent Application No. 8-265015, the assignee of the present application has presented a module in which electrodes are arranged on both main surfaces of a dielectric sheet to form a dielectric resonator on a part of the sheet. The electrodes arranged on the dielectric sheet serve as ground potentials; and a microstrip arranged on another dielectric sheet is stacked on the dielectric sheet. This arrangement is used in a high-frequency module such as a VCO.

In addition, a similar type of high-frequency module has been presented in Japanese Patent Application Serial No. 8-294087 and the U.S. patent application Ser. No. 08/965,464, now U.S. Pat. No. 6,016,090. FIGS. 5 to 8 illustrate the structure of the high-frequency module. It should be noted that this high-frequency module was not laid-open to the public at the time of filing of the Japanese Application No. 10-17006 on which the present application is based. Thus, the inventors do not deem the high-frequency module of FIGS. 5–8 to be prior art with respect to the present invention.

FIG. 5 shows a perspective view of the module. Here, electrodes 2 and 3 are formed on both main surfaces of a dielectric sheet 1, excluding a part of each main surface of the sheet, where openings 4 and 5, respectively, are located. This permits a TE010-mode dielectric resonator to be formed. Two coupling lines 11 and 12, which are formed on a dielectric or insulating substrate 6, are magnetically coupled to the dielectric resonator.

As shown in FIG. 6, since the electromagnetic field is trapped between the openings 4 and 5, coupling between the various components, except between the lines 11 and 12 and the resonator, can be reduced. Moreover, the concentration of electromagnetic-field energy at the openings permits a strong coupling between the resonator and the coupling lines, resulting in an increase in the frequency range over which the oscillation frequency can vary, when the resonator is used as an oscillator.

However, the impedance of the lines 11 and 12 at the opening is a little higher than that of the lines in other areas, since no ground electrode is present at the upper and lower part of the opening. As a result, reflection of a transmitted signal due to impedance mismatching occurs, leading to a generation of a spurious resonance due to the electrical length between the part that causes the reflection and a negative resistance circuit. This is a problem which is unique to a TE010-mode dielectric resonator and is not a problem in a TE01δ-mode dielectric resonator.

In FIG. 5, the lines 11 and 12 passing over the opening are straight. With this shape, the impedance of each line increases with the distance away from the edge of the opening, i.e., toward the center of the opening, as shown in FIG. 7. That is, an impedance mismatch occurs. Thus, a resonance is produced at a frequency that is different from the desired resonant frequency of the dielectric resonator.

FIG. 8 shows a Smith chart in which the r direction indicates the magnitude of the reflection generated by a resonance, while the θ direction denotes the phase of the reflection. In the module shown in FIG. 5, a resonance due to impedance mismatching of the coupling lines occurs, in tune with the spurious resonance produced by the dielectric resonator.

The module is designed under the assumption that the characteristic impedance of each coupling line is uniform. However, in practice, the characteristic impedance is position-dependent. Therefore, when the frequency of a signal applied to the module is changed, the distribution of the electromagnetic field around each coupling line is also changed. Thus, the coupling strength deviates from its expected value.

Thus, when such a resonator is used in a voltage-controlled oscillator, the position-dependence of the characteristic impedance of the coupling lines causes their characteristic impedance to change in response to a change in the oscillation frequency. Consequently, the linearity of frequency modulation with such a VCO becomes a problem to be considered.

SUMMARY OF THE INVENTION

Accordingly, it is desired to provide a high-frequency module that reduces parasitic oscillation due to impedance mismatching.

It is also desired to provide a high-frequency module which allows frequency modulation with enhanced linearity.

In the following summary of the invention, the symbol Z0 denotes a characteristic impedance of the area in which the ground electrode and the line are opposing, while the symbol Z1 denotes a characteristic impedance of the area in which they are not opposing, namely, the area over the opening. When an end of the line is resistively terminated, the magnitude of a reflection coefficient at the point where the line is electro-magnetically coupled to a dielectric resonator (hereinafter referred to as a resonant point) is represented by the formula: $(Z1^2-Z0^2)/(Z1^2+Z0^2)$. The larger the ratio of Z1/Z0, the greater the reflection.

On the other hand, a capacitive component of the line exists mainly at a location where the edge of the opening opposes the line. Thus, by shortening the distance between the edge of the opening and the line, the capacitance of the line can be increased, and the characteristic impedance of the line can be suppressed. In addition, reducing the position-dependency of the characteristic impedance of the line permits the linearity of frequency modulation to be enhanced.

This invention provides a high-frequency module including a dielectric sheet, electrodes disposed on both main surfaces of the sheet, an opening formed in each electrode and aligned so that the openings form a dielectric resonator, lines coupled to the dielectric resonator, a substrate having the lines thereon and being stacked on the dielectric sheet, and a conductive case to contain the substrate and the dielectric sheet; in which a first one of the lines coupled to the dielectric resonator is arranged along a path corresponding to the inside of the opening and running substantially along the edge of the opening.

With the above arrangement, the impedance of the line around the opening is not increased, leading to a reduction in the amount of reflected RF energy. There is also a second line, one end of which may be resistively terminated and the other end of which may be connected to a negative resistance circuit so as to form an oscillator. Thus, a parasitic oscillation can be controlled.

Furthermore, an end of the first line coupled to the dielectric resonator may be connected to a variable reactive element. Moreover, one end of the second line may be resistively terminated and the other end of the second line may be connected to a negative reactive circuit to form an oscillator. This arrangement permits the linearity of frequency modulation to be enhanced, since the position-dependency of the characteristic impedance of the line connected to the variable reactive element is small.

Moreover, if desired, both of the lines may be arranged at positions which correspond to the inside of the opening and run substantially along the edge of the opening. This permits parasitic oscillation to be suppressed, so that an oscillator having a high linearity of frequency modulation can be obtained.

Other features and advantages of the present invention will become apparent from the following description of embodiments of the invention which refers to the accompanying drawings.

DESCRIPTION OF EMBODIMENTS OF THE INVENTION

Figure 1:
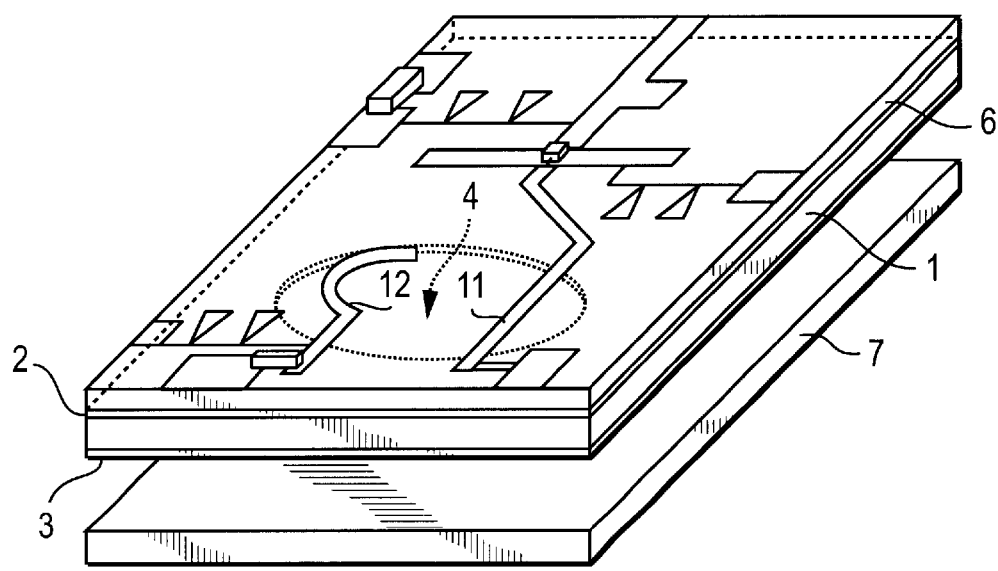
FIG. 1 is a partially-cutaway perspective view showing a structure of the main part of a voltage-controlled oscillator (VCO) according to a first embodiment of the present invention.
Figure 2:
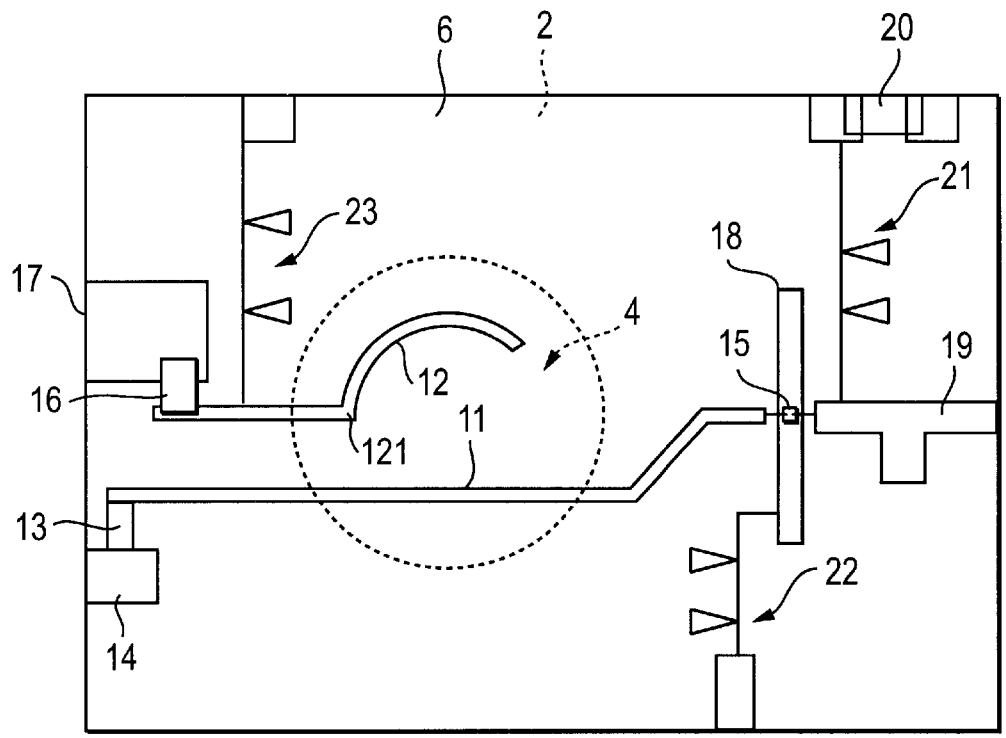
FIG. 2 is a plan view of the VCO of FIG. 1.
Figure 3:
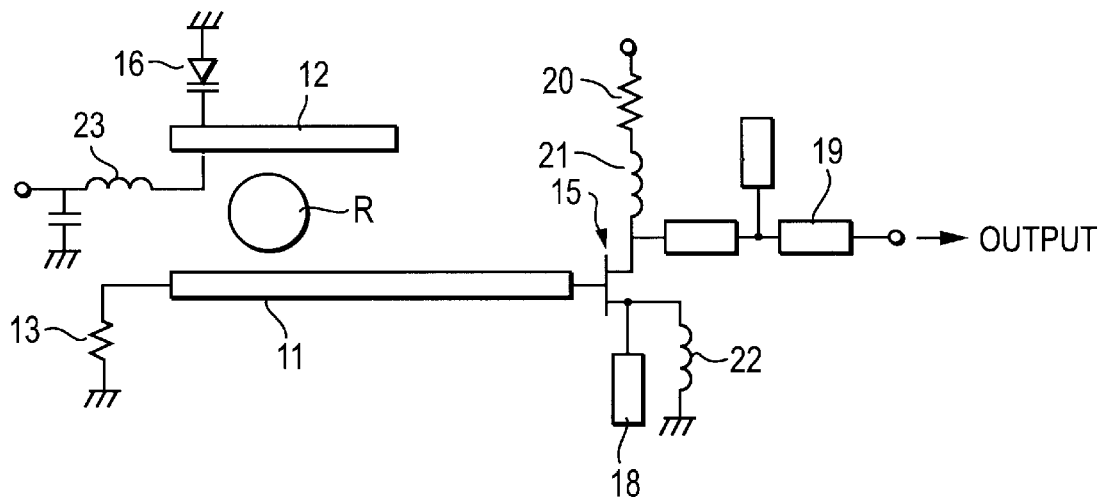
FIG. 3 is an equivalent circuit diagram of the VCO.

Referring now to the drawings, a description will be given of the embodiments of the present invention. FIGS. 1 to 3 show a structure of a VCO (voltage-controlled oscillator) employed in a first embodiment of the present invention.

FIG. 1 is a partially-cutaway perspective view showing a structure of the main part of the VCO. Here, conductive electrodes 2 and 3 are respectively formed on both main surfaces of a dielectric sheet 1, excluding a certain part of the sheet, so as to define an upper opening 4 and a lower opening (not shown) which provide a TE010-mode dielectric resonator. A main line 11 and a sub-line 12 are formed on a surface of a substrate 6, which is a dielectric or insulating sheet. The substrate 6 is stacked on the dielectric sheet 1, and the lines 11 and 12 are magnetically coupled to the dielectric resonator.

For simple illustration, FIG. 1 shows only a part of a conductive case 7 enclosing the layered structure. Preferably, the conductive case 7 has at least two conductive surfaces opposing at least upper and lower main surfaces of the layered structure. In addition, the space between the conductive upper and lower surfaces of the case and the main surfaces of the layered structure is preferably adjusted in such a manner that a signal having a frequency equal to the resonant frequency of the dielectric resonator is attenuated within the space, except at the openings which define the resonator. An example of an arrangement for confining a signal at such a resonator is disclosed in Ser. No. 08/882,890 filed Jun. 26, 1997, allowed, and its parent application Ser. No. 08/620,918 filed Mar. 22, 1996, now U.S. Pat. No. 5,764,116, the disclosures of which are incorporated herein by reference.

FIG. 3 is an equivalent circuit diagram of the VCO described above. A symbol R denotes a dielectric resonator. In this figure, an end of the main line 11 is resistively terminated and the other end of the line is connected to a negative resistance circuit employing an FET 15 so as to form an oscillator. Further, a varactor diode 16 is connected to the sub-line 12 which is coupled to the dielectric resonator R. Its reactance is changed by applying a bias voltage, in order to control the oscillator frequency.

FIG. 2 is a plan view of the VCO. In this figure, numeral 11 denotes a main line, and numeral 12 denotes a sub-line. Between an end of the main line 11 and a ground electrode 14 is connected a termination resistor 13, while the other end of the line 11 is connected to the FET 15, which is mounted on a series feedback line 18. Numeral 20 denotes a chip resistor, numerals 21 and 22 denote bias circuits for the FET 15, and numeral 19 is an output circuit. An end of the sub-line 12 is grounded through a variable reactive element such as the varactor diode 16. Numeral 23 denotes a bias circuit for the varactor diode 16.

In this embodiment, the oscillation frequency of the dielectric resonator is 30 GHz, the relative dielectric constant of the dielectric sheet is 24, and the relative dielectric constant of the substrate 6 is 3.4. A curved part of the sub-line is formed substantially in the shape of a partial circle in such a manner that the sub-line 12 follows a path 0.4 mm away from the inner edge of the opening. The sub-line 12 has a straight part, which extends toward the dielectric resonator from the varactor diode 16. The length of the straight part of the sub-line 12 is substantially equal to ¼ wavelength of an electromagnetic wave having the desired resonant frequency. The length of the straight part of the sub-line 12 is defined as the distance between the varactor diode 16 and a corner 121 of the sub-line, from which the curved part starts.

As shown here, the distance between the sub-line 12 and the electrode 2 around the dielectric resonator is substantially fixed, so that the characteristic impedance of the sub-line 12 is almost constant at any position around the resonator. Accordingly, a satisfactory linearity of frequency modulation of the VCO is obtainable.

Figure 9:
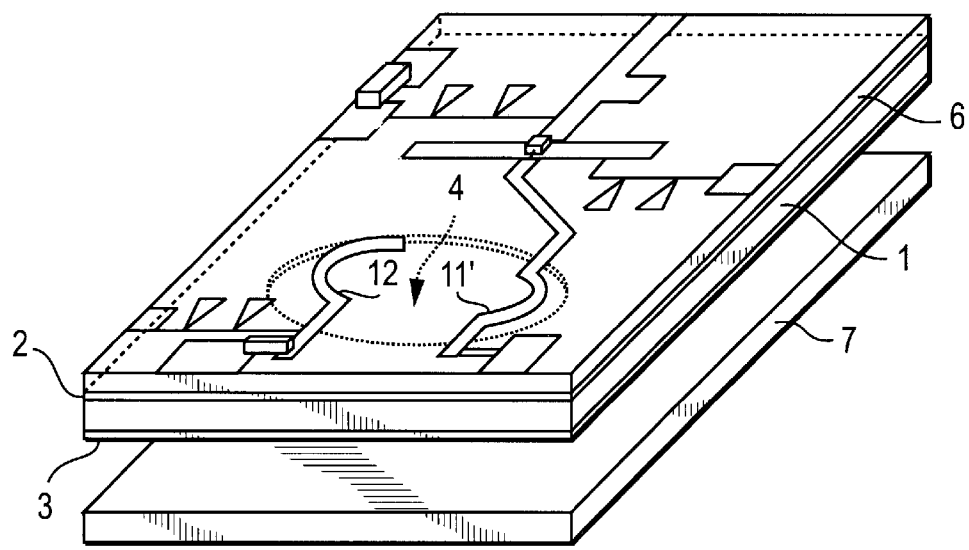
FIG. 9 is a partially-cutaway perspective view showing a structure of the main part of a voltage-controlled oscillator (VCO) according to a third embodiment of the present invention.
Figure 10:
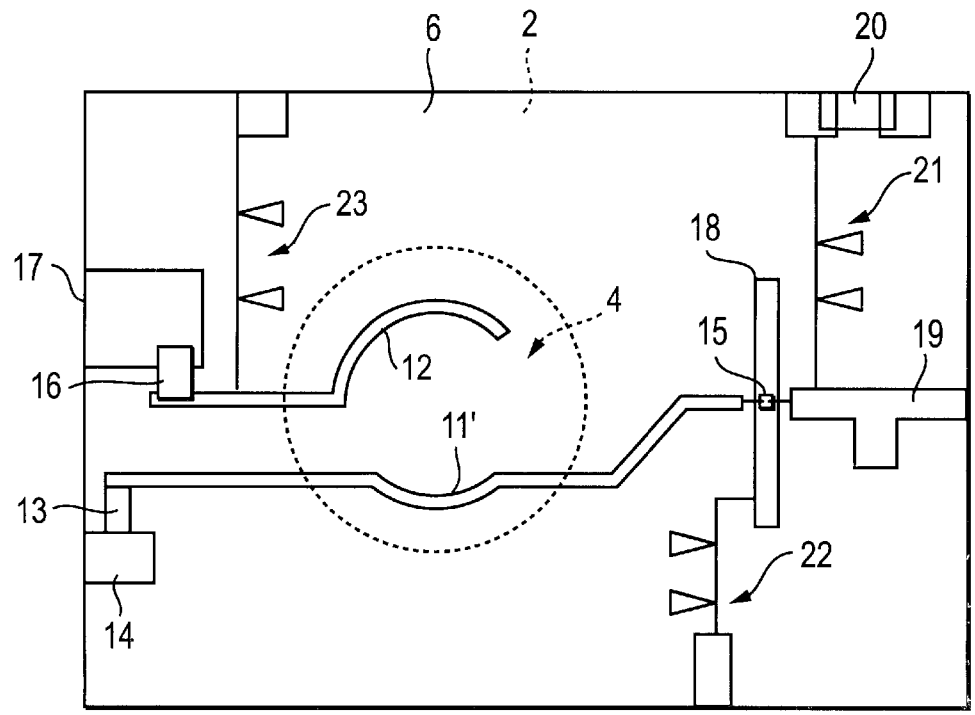
FIG. 10 is a plan view of the VCO of FIG. 9.

In an alternate embodiment, shown in FIGS. 9 and 10, the main line 11' and the sub-line 12 are both curved in such a manner that they extend along the inner edge of the opening. In all other respects this embodiment is the same as that in FIGS. 1–2. This permits the linearity of the frequency modulation to be further enhanced, and in addition, parasitic oscillation can be suppressed.

Figure 4:
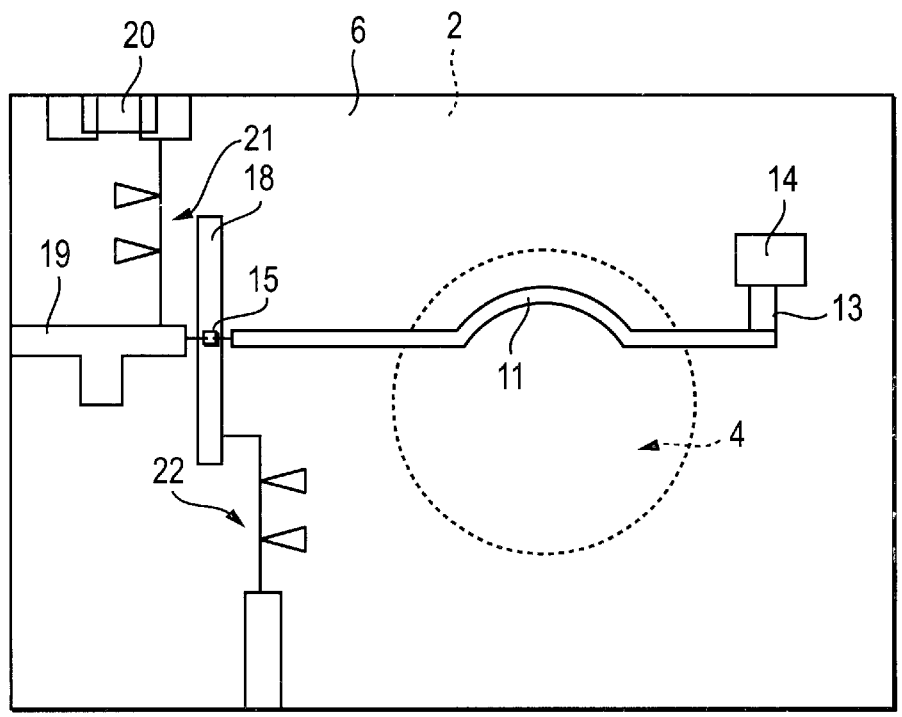
FIG. 4 is a plan view showing a structure of an oscillator according to a second embodiment of the present invention.
Figure 5:
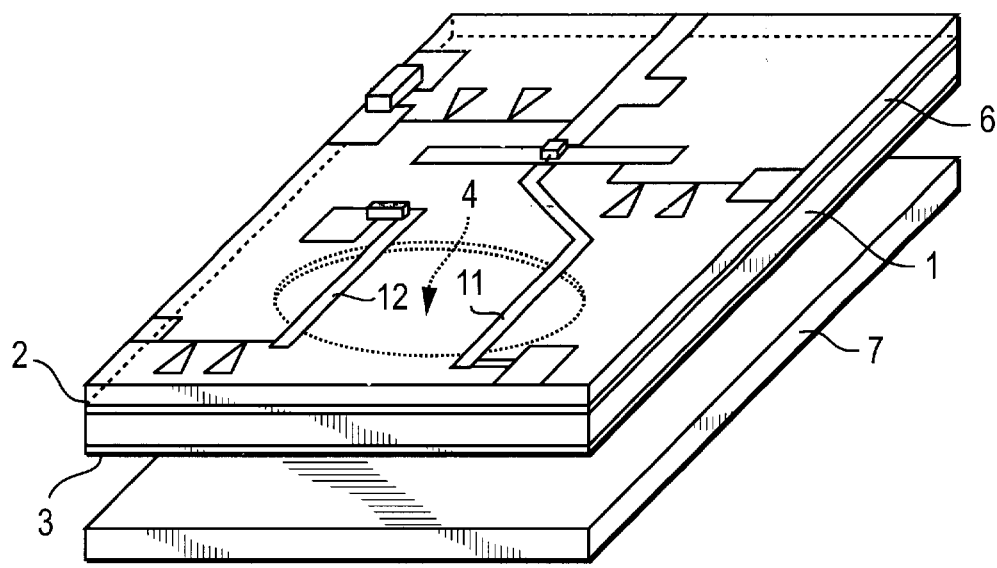
FIG. 5 is a partially-cutaway perspective view showing a structure of another type of VCO.
Figure 6:
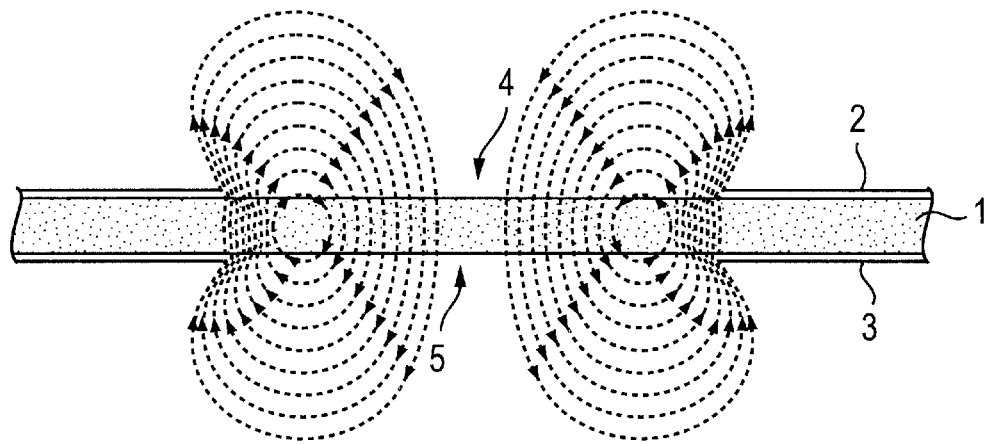
FIG. 6 shows an example of an electromagnetic distribution of a TE010-mode dielectric resonator arranged on a dielectric sheet.
Figure 7:
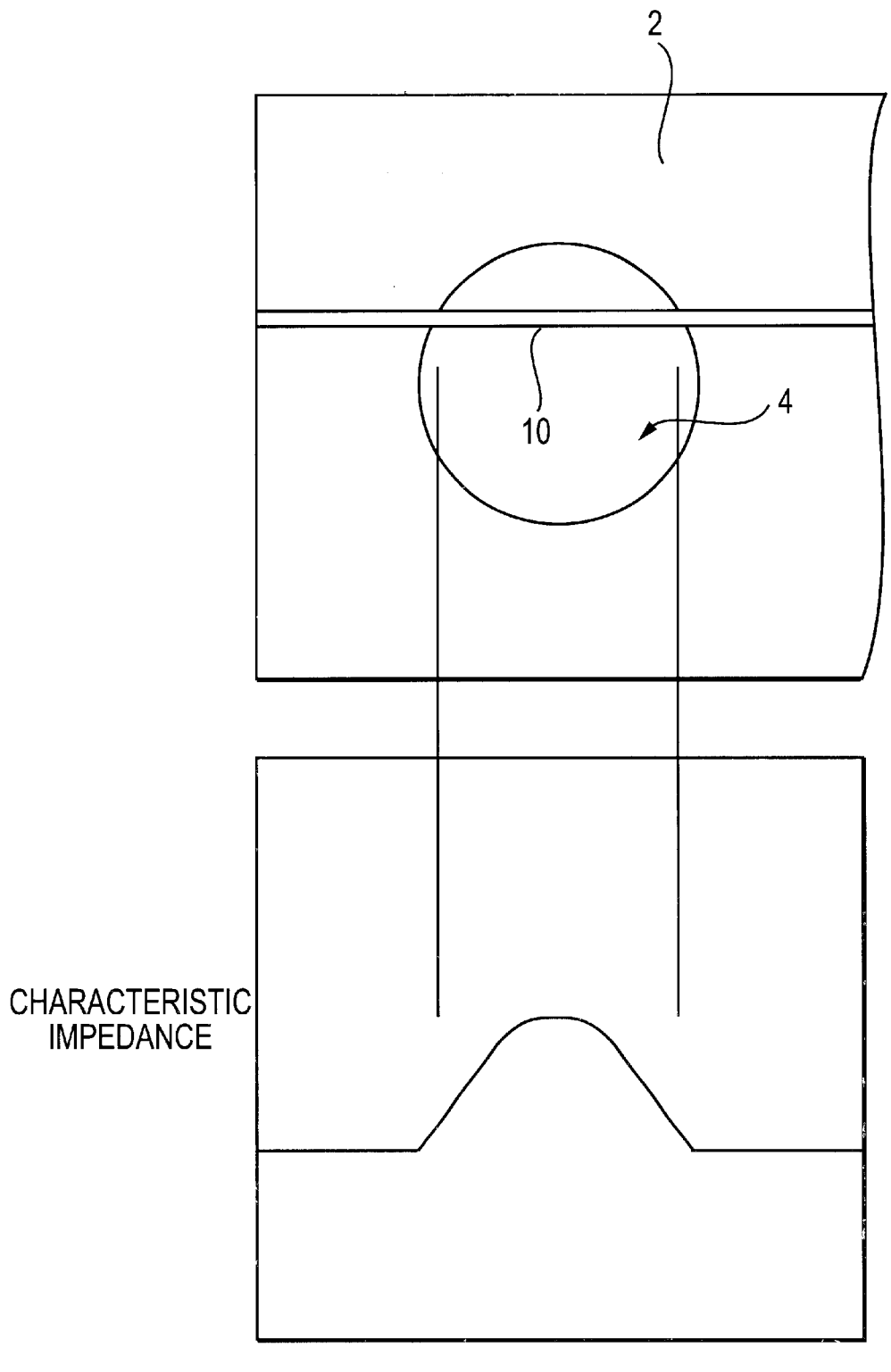
FIG. 7 shows an example of a characteristic impedance of a line coupled to a dielectric resonator.
Figure 8:
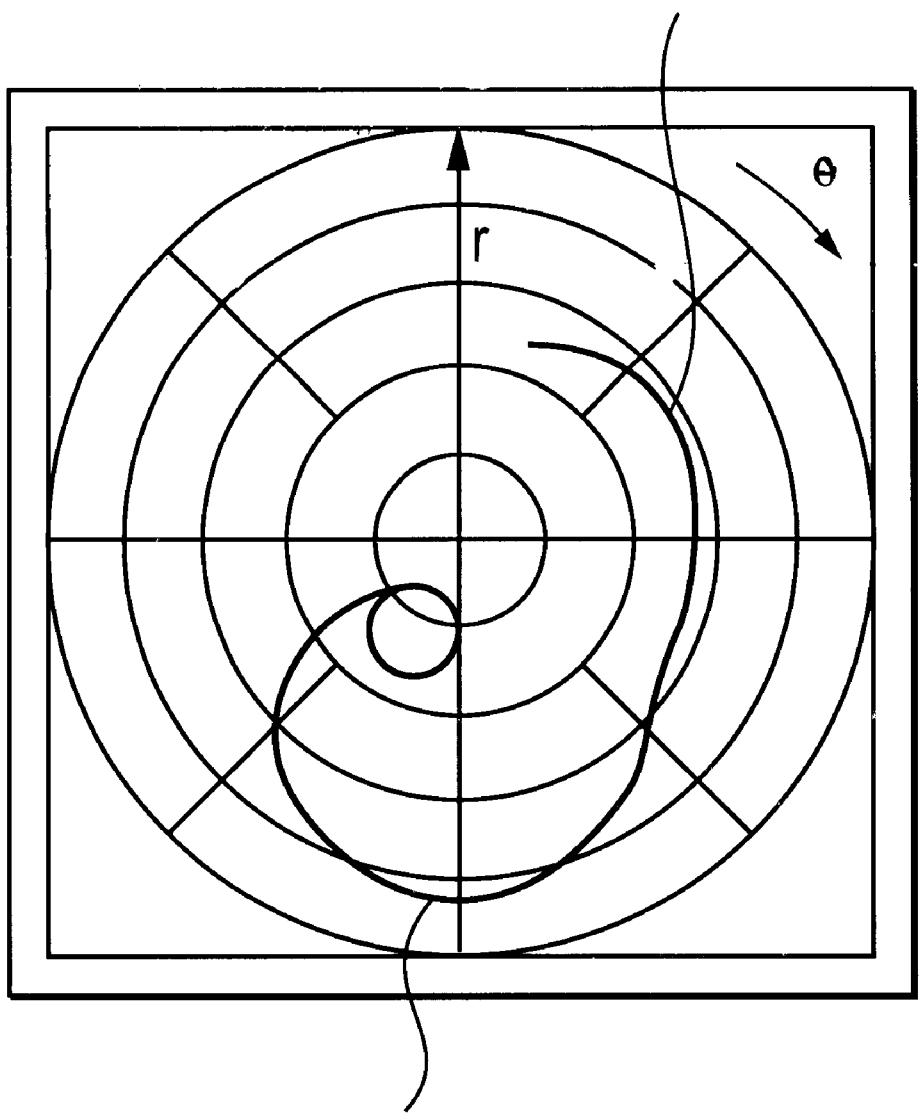
FIG. 8 is a view of an example of a parasitic oscillation generated by the coupling line.

FIG. 4 is a plan view of an oscillator according to a second embodiment of the present invention. The oscillator shown here has neither a sub-line nor a varactor diode, since it is an oscillator having a fixed oscillation frequency. In this figure, a straight coupling line 11 extends from a termination resistor 13 to a dielectric resonator 4, continues a small distance into the resonator, namely, about 0.4 mm, and then extends along the inner periphery of the resonator. Further, after passing around the periphery of the resonator, the line 11 exits the resonator at an appropriate point, and continues straight to an FET 15.

Similar to the first embodiment, in the second embodiment, the resonant frequency is 30 GHz, the relative dielectric constant of a dielectric sheet is 24, and the relative dielectric constant of a substrate 6 is 3.4. Although the second embodiment adopts a straight form for the main line 11 outside of the resonator, the form may be modified if necessary in view of economic considerations.

This arrangement allows an increase in the capacitance of the main line 11, and controls the increase in characteristic impedance of the main line 11 in the area of the electrode opening 4. As a result, the impedance mismatching of the line 11 can be suppressed so as to control unnecessary resonance due to reflection.

Although the present invention has been described in relation to particular embodiments thereof, many other variations and modifications and other uses will become apparent to those skilled in the art. Therefore, the present invention is not limited by the specific disclosure herein.

What is claimed is:

1. A high-frequency module comprising:
   a dielectric sheet having two opposed main surfaces;
   electrodes disposed on both main surfaces of the sheet;
   a pair of openings formed respectively in the electrodes and having corresponding aligned edges so as to provide a dielectric resonator;
   first and second conductive lines disposed on a substrate, said substrate being stacked on said dielectric sheet, said lines being magnetically coupled to the dielectric resonator; and
   a conductive case containing said substrate and said dielectric sheet;
   wherein said first line has a first portion arranged along a path which runs substantially along said edges of the openings;
   wherein said edges have a curved shape and said first line portion has substantially the same curved shape; and
   wherein said second line is substantially straight.

2. A high-frequency module according to claim 1, wherein said second line has an end which is resistively terminated and another end which is connected to a negative resistance circuit, said resonator being comprised in an oscillator.

3. A high frequency module according to claim 1, wherein said first line has an end which is connected to a variable reactive element, and said second line has an end which is resistively terminated and another end which is connected to a negative resistance circuit, said resonator being comprised in an oscillator.

4. A high-frequency module according to claim 3, wherein said second line has a first portion which is arranged along a path which runs substantially along the edges of the openings.

5. A high-frequency module according to claim 1, wherein said first line crosses the edges of the openings at one point.

6. A high-frequency module according to claim 1, wherein said edges and said first line portion have substantially a partial circular shape and wherein said first line portion runs a substantially constant distance inside said edges.

7. A high-frequency module according to claim 6, wherein said first line portion is disposed substantially 0.4 mm inwardly from said edges.

8. A high-frequency module according to claim 7, wherein said dielectric sheet and substrate have relative dielectric constants of 24 and 3.4, respectively, and said dielectric resonator has a resonant frequency of 30 GHz.

9. A high-frequency module according to claim 1, wherein said second line crosses the edges of the opening at two points.

10. A high-frequency module according to claim 1, wherein said second line has a first portion which is arranged along a path which runs substantially along the edges of the openings.

11. A high-frequency module according to claim 10, wherein said second line crosses the edges of the opening at two points.

12. A high-frequency module comprising:
    a dielectric sheet having two opposed main surfaces;
    electrodes disposed on both main surfaces of the sheet;
    a pair of openings formed respectively in the electrodes and having corresponding aligned edges so as to provide a dielectric resonator;
    first and second conductive lines disposed on a substrate, said substrate being stacked on said dielectric sheet, said lines being magnetically coupled to the dielectric resonator; and
    a conductive case containing said substrate and said dielectric sheet;
    wherein said first line has a first portion arranged along a path which runs substantially along said edges of the openings;
    wherein said edges have a curved shape and said first line portion has substantially the same curved shape;
    wherein said second line has a first portion which is arranged along a path which runs substantially along the edges of the openings; and
    wherein said edges and said first portion of said second line have substantially a partial circular shape and wherein said first portion of said second line runs a substantially constant distance inside said edges.

13. A high-frequency module according to claim 12, wherein said first portion of said second line is disposed substantially 0.4 mm inwardly from said edges.

* * * * *